(12) United States Patent
Cassagnes et al.

(10) Patent No.: US 8,193,828 B2
(45) Date of Patent: Jun. 5, 2012

(54) BUFFER APPARATUS, INTEGRATED CIRCUIT AND METHOD OF REDUCING A PORTION OF AN OSCILLATION OF AN OUTPUT SIGNAL

(75) Inventors: Thierry Cassagnes, Tournefeuille (FR); Valerie Bernon-Enjalbert, Fonsorbes (FR); Philippe Lance, Toulouse (FR); Matthijs Pardoen, Pompertuzat (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/056,334

(22) PCT Filed: Jul. 31, 2008

(86) PCT No.: PCT/IB2008/054166
§ 371 (c)(1),
(2), (4) Date: Jan. 28, 2011

(87) PCT Pub. No.: WO2010/013097
PCT Pub. Date: Feb. 4, 2010

(65) Prior Publication Data
US 2011/0121858 A1  May 26, 2011

(51) Int. Cl.
*H03K 17/16* (2006.01)
*H03K 19/003* (2006.01)

(52) U.S. Cl. ............... 326/22; 326/21; 326/29; 326/31
(58) Field of Classification Search ................... None
See application file for complete search history.

(56) References Cited

U.S. PATENT DOCUMENTS

| | | | |
|---|---|---|---|
| 4,169,996 A | 10/1979 | Cavigelli | |
| 5,010,256 A | 4/1991 | Dicke | |
| 5,717,343 A | 2/1998 | Kwong | |
| 5,801,550 A | 9/1998 | Tanaka et al. | |
| 6,262,607 B1 | 7/2001 | Suzuki | |
| 6,271,709 B1 | 8/2001 | Kimura et al. | |
| 2002/0084800 A1 | 7/2002 | Crittenden et al. | |
| 2003/0141894 A1* | 7/2003 | Gonzalez | 326/26 |

OTHER PUBLICATIONS

International Search Report and Written Opinion correlating to PCT/IB2008/054166 dated Mar. 20, 2009.

* cited by examiner

*Primary Examiner* — Anh Tran

(57) ABSTRACT

A buffer apparatus for a communications bus comprises a driver circuit having an output. An amplifier circuit having an input is coupled to the output of the driver circuit. The driver circuit is arranged to generate, when in use, a drive signal having a waveform that comprises a step therein so as to substantially suppress generation by the amplifier circuit of a portion of an oscillation of an output signal.

20 Claims, 4 Drawing Sheets

BUFFER APPARATUS, INTEGRATED CIRCUIT AND METHOD OF REDUCING A PORTION OF AN OSCILLATION OF AN OUTPUT SIGNAL

FIELD OF THE INVENTION

This invention relates to a buffer apparatus of the type that, for example, comprises a driver that drives an amplifier circuit for generating an output signal used on communications bus. The present invention also relates to an integrated circuit of the type that, for example, comprises a driver that drives an amplifier circuit for generating an output signal used on communications bus. The present invention further relates to a method of reducing a portion of an oscillation of an output signal, the method being of the type that, for example, generates a drive signal to drive an amplifier circuit in order to generate the output signal for a communications bus.

BACKGROUND OF THE INVENTION

In the field of automotive electronics, a so-called Distributed System Interface (DSI) was developed by Motorola Inc./Freescale Semiconductor Inc. and is a specification for implementing a bus for safety applications. The DSI specification describes bus topology, physical characteristics, message protocols and classes, formats, bit transmission orders and a method of programming devices having programmable addresses.

The DSI is a type of so-called Niche Area Network (NAN) and was designed to interconnect a number of remote sensor devices and actuators with a control module. The DSI provides a highly robust moderate speed interconnection that is also a low cost solution, whilst only using two wires. Furthermore, the DSI is fail safe, deterministic and has good Electromagnetic Compatibility (EMC) characteristics.

A typical application for the DSI is for implementing a bus supporting an airbag system, the airbag system having multiple components that can be embedding in, for example, instrument panels, steering columns and seats.

The DSI implements a master-slave architecture to maintain simplicity of implementation. The DSI also implements Cyclic Redundancy Check (CRC) codes and remote self-diagnostics in order to maintain robustness.

In one typical implementation, a master module is coupled to a first slave module, a second slave module, a third slave module and a fourth slave module in a serial manner. As mentioned above, the bus is implemented on a pair of wires, the pair of wires being used to couple the master module and the first, second, third and fourth slave modules and allow application of a differential voltage signal by the master module. In order to reduce EMC emissions and provide resistance to Electrostatic Discharge (ESD) events, input and output capacitive loads are coupled across pairs of differential input and output terminals of the first, second, third and fourth slave modules. Additionally, a so-called "holding capacitor" is provided in respect of each of the first, second, third and fourth slave modules and is provided to power the slave modules.

The master module comprises an amplifier circuit, for example of the Operational Amplifier (Op-amp) type, and is used to communicate a differential output voltage signal on the bus, via a differential output thereof, to the first, second, third and/or fourth slave modules in accordance with the DSI specification. In this respect, the master module has an idle mode and a signal mode. In the idle mode, the amplifier circuit generates, for example, a 25V differential output voltage, or another value of output voltage depending upon the maximum voltage supply supported by a vehicle in which the bus is provided. However, upon entering the signal mode, the differential output voltage reduces to, for example, 4.5V. Each of the first, second, third and fourth slave modules comprises a comparator circuit that recognises the transition of the differential output voltage signal of the master module and, responsive to the detected transition, enters a respective signal mode.

The bus is a full duplex bus, the master module transmitting to the slave modules using a voltage signal and each of the slave modules using a current signal to transmit to the master module. To this end, the voltage signal used by the master module is a duty cycle modulated signal and the current signal used by the slave modules is an amplitude modulated current signal. In accordance with the DSI specification, responses to commands sent by the master module are sent by the slave modules, during a response time, the response signals being self-synchronised to a falling voltage edge generated by the master module during transmission of a pulse train of any combination of logic ones and zeros.

It is known that the amplifier circuit of the master module is characterised by a number of parameters, including slew rate: the rate of change of voltage with time. When generating a duty cycle modulated signal, the amplifier circuit generates a waveform that comprises a rising edge, a substantially constant level portion, followed by a falling edge, the waveform approximating to a digital pulse. Due to the slew rate of the amplifier circuit, the rising edge is not perfectly vertical, but inclined. Similarly, the falling edge is also sloped due to the slew rate of the amplifier circuit. Furthermore, due to the capacitive loading on the output of the amplifier circuit, the output voltage signal does not reach the voltage level desired in a neat and precise manner and so the output voltage signal possesses a transient or damped oscillation, sometimes referred to as overshoot and undershoot, that exceeds a level desired and then falls back below the level desired before settling at the desired voltage level. The transient therefore has a settling time associated therewith.

During the response time, when the master module is generating the arbitrary pulse train of ones and zeros, the initial, rising, overshoot results in the capacitive load on the master module drawing current to charge the capacitive load, and subsequent, falling, undershoot results in the capacitive load on the master module discharging.

The charging and discharging of the capacitive load results in a current signal being generated on the bus. In the case of the rising overshoot, the current generated corresponds, if detected, to a logic one, whereas in the case of the falling undershoot, the current generated corresponds, if detected, to a logic zero.

Typically, the currents generated as a result of the transient signal are not detected because the transient settles before the falling voltage edge generated by the output of the master module and so are not detected by the master module. However, if the erroneously generated current signals were to be detected by detection circuitry of the master module, the current signal could be misconstrued as a response from one of the slave modules or the current signal could mask or conceal a response from one or more of the slave modules.

As mentioned above, the DSI specification supports moderately high speed communications. However, it is desirable to increase the speed of communications supported by hardware, for example an integrated circuit, implementing the DSI specification. In this respect, it is desirable to support data rates of up to, for example, 200 kbps. When the period of the duty cycle modulated output voltage signal is reduced, the location of the occurrence of the erroneous current signal generated in response to, for example, the undershoot of the output voltage signal of the master module translates to or beyond the location, in time, of the falling voltage edge generated by the master module during the response time. Consequently, the erroneous current signals are detected by the master module and the above-mentioned symptoms associated with detection of the erroneous current signals become problematic.

U.S. Pat. No. 4,169,996 relates to an operational amplifier with slew recovery enhancement. A circuit is disclosed that implements a closed-loop solution comprising a first, inner, feedback loop and a second, outer, feedback loop. However, provision of multiple feedback loops constitutes additional circuit complexity associated with a closed-loop solution. It is, of course, desirable to avoid additional complexity due to die space and cost implications thereof.

SUMMARY OF THE INVENTION

The present invention provides a buffer apparatus as described in the accompanying claims.

The present invention provides an integrated circuit as described in the accompanying claims.

The present invention provides a method of reducing a portion of an oscillation of an output signal as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
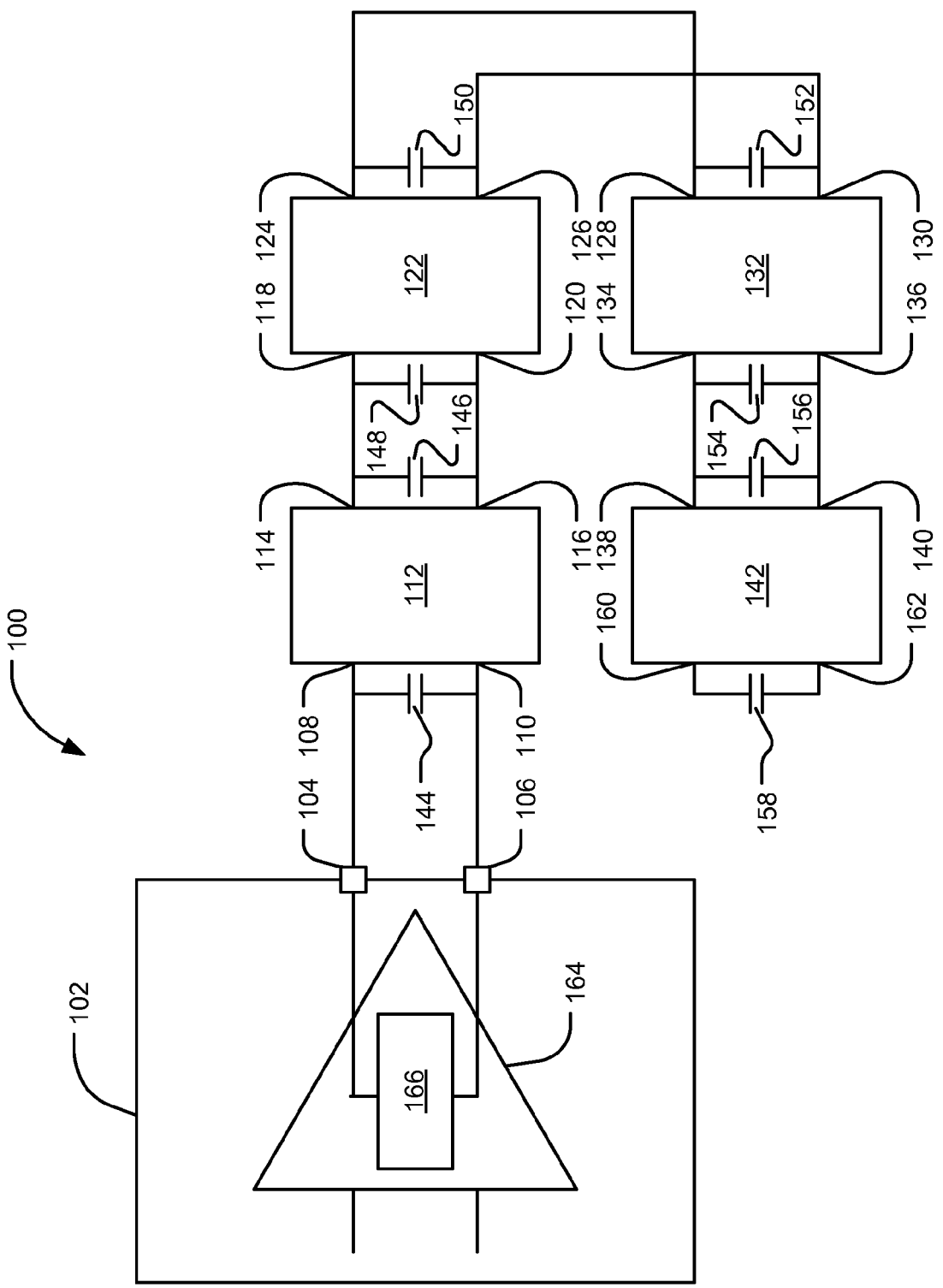
FIG. 1 is a schematic diagram of a system comprising a master module constituting an embodiment of the invention.

Throughout the following description, identical reference numerals will be used to identify like parts.

Referring to FIG. 1, a Distributed System Interface (DSI) bus system 100 capable of data rates of up to about 200 kbps comprises a master module 102 having a first differential terminal 104 and a second differential terminal 106. The first and second differential terminals 104, 106 of the master module 102 are coupled to respective first and second differential terminals 108, 110 of a first slave module 112. Third and fourth differential terminals 114, 116 of the first slave module 112 are coupled to respective first and second differential terminals 118, 120 of a second slave module 122. Third and fourth differential terminals 124, 126 of the second slave module 122 are coupled to respective first and second differential terminals 128, 130 of a third slave module 132. Third and fourth differential terminals 134, 136 of the third slave module 132 are coupled to respective first and second differential terminals 138, 140 of a fourth slave module 142.

In order to reduce Electromagnetic Compatibility (EMC) emissions and provide immunity to Electrostatic Discharge (ESD) events, a first input capacitor 144 is coupled between the first and second differential terminals 108, 110 of the first slave module 112 and a first output capacitor 146 is coupled between the third and fourth differential terminals 114, 116 of the first slave module 112. A second input capacitor 148 is also coupled between the first and second differential terminals 118, 120 of the second slave module 122 and a second output capacitor 150 is also coupled between the third and fourth differential terminals 124, 126 of the second slave module 122. Similarly, a third input capacitor 152 is coupled between the first and second differential terminals 128, 130 of the third slave module 132 and a third output capacitor 154 is coupled between the third and fourth differential terminals 134, 136 of the third slave module 132. Likewise, a fourth input capacitor 156 is coupled between the first and second differential terminals 138, 140 of the fourth slave module 142 and a fourth output capacitor 158 is coupled between third and fourth differential terminals 160, 162 of the fourth slave module 142.

In this example, the DSI bus system 100 is part of a driver and passenger safety system for a vehicle that controls deployment of airbags in the event of the vehicle sustaining certain types of impact. The first, second, third and fourth slave modules 112, 122, 132, 142 are, in this example, accelerometers disposed at the periphery of the vehicle, the first, second, third and fourth slave modules 112, 122, 132, 142 being separated from each other by approximately 4 meters of cabling, the cabling between the slave modules being of the two-wire type and constituting part of a bus. Additionally, a portion of the bus that separates the master module 102 from the first slave module 112 is approximately 8 meters in length.

The master module 102 is, in this example based upon the MC 33781 master module integrated circuit available from Freescale Semiconductor, Inc. and comprises a buffer apparatus 164 that includes, for the sake of completeness, a current sensor 166 for detecting current signals transmitted from the first, second, third or fourth slave module 112, 122, 132, 142 in accordance with the DSI specification mentioned previously above.

Figure 2:
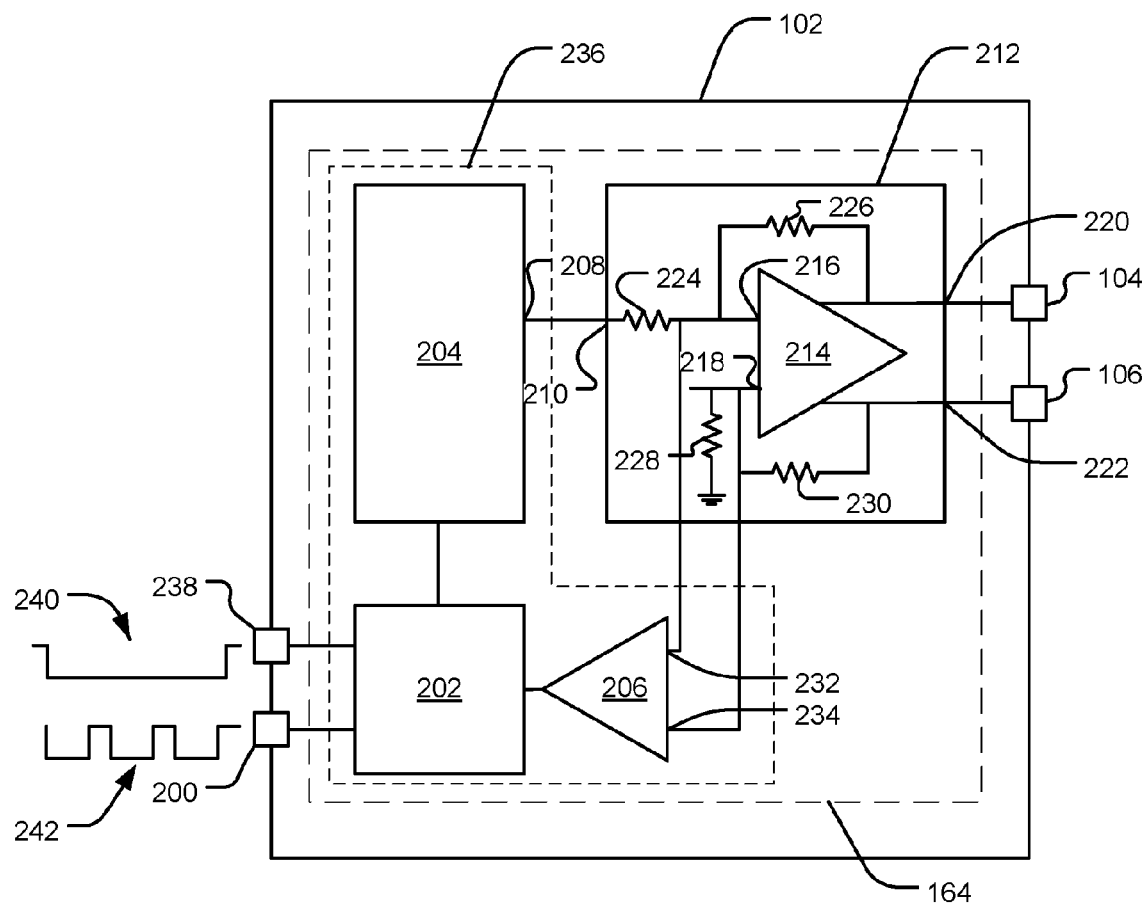
FIG. 2 is a schematic diagram of part of the master module of FIG. 1.

Turning to FIG. 2, and as mentioned above, the master module 102 comprises the buffer apparatus 164. The buffer apparatus 164 has a single-ended signal input 200 coupled to a state machine 202. The state machine 202 constitutes a controller, and is coupled to a voltage converter 204 and a comparator 206, constituting a signal monitor. An output 208 of the voltage converter unit 204 is coupled to an input 210 of an amplifier circuit 212, the amplifier circuit 212 comprising an operational amplifier circuit 214 having a differential input comprising a non-inverting input 216 and an inverting input 218. The amplifier circuit 212 also has a differential output comprising a non-inverting output 220 and an inverting output 222. The non-inverting input 216 is coupled to the input 210 of the amplifier circuit 212 via a first resistance 224 and the non-inverting output 220 is coupled to the non-inverting input 216 via a second resistance 226. The inverting input 218 is coupled to ground potential via a third resistance 228 and the inverting output 222 is coupled to the inverting input 218 via a fourth resistance 230.

A non-inverting input 232 of the comparator 206 is coupled to the non-inverting input 216 of the operational amplifier circuit 214 and an inverting input terminal 234 of the comparator 206 is coupled to the inverting input terminal 218 of the operational amplifier circuit 214. The voltage converter 204, the state machine 202 and the comparator 206 constitute a driver circuit 236. The non-inverting output 220 and the inverting output 222 of the amplifier circuit 214 are respectively coupled to the first differential terminal 104 and the second differential terminal 106. A frame signal input 238 is also provided and coupled to the state machine 202.

Figure 4:
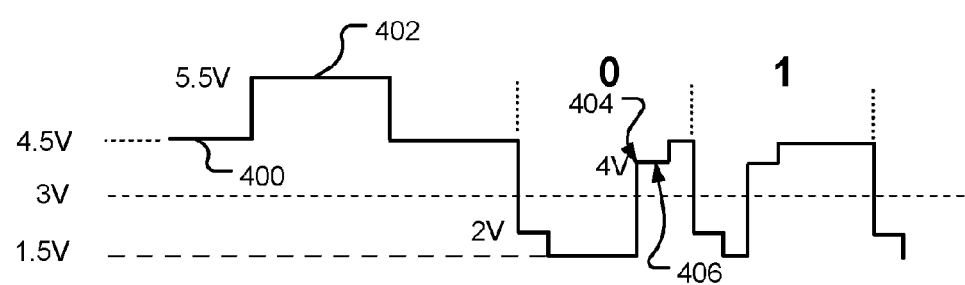
FIG. 4 is an illustration of a waveform generated by the master apparatus of FIG. 1.
Figure 3:
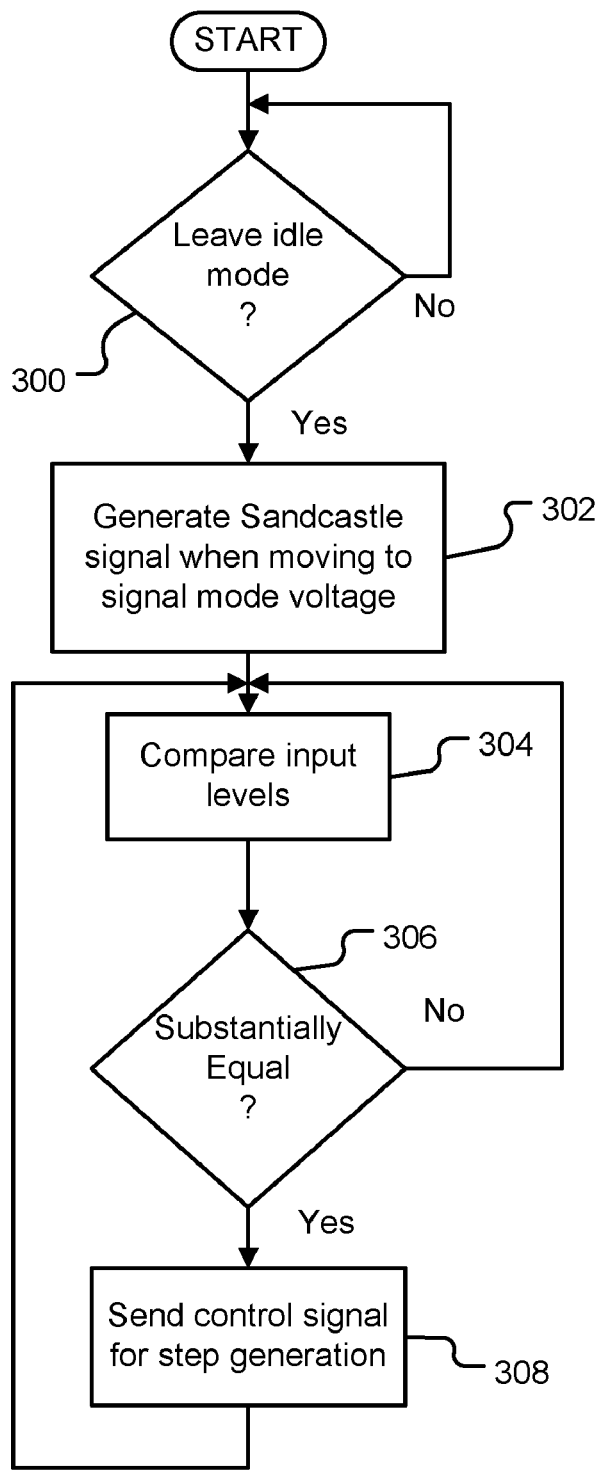
FIG. 3 is a flow diagram of operation of the master module of FIG. 1.

In operation (FIG. 3), the master module 102 is initially in an idle mode. In the idle mode, the voltage converter 204 generates an initial drive signal 400 (FIG. 4) that is, in this example, 4.5V. However, in the idle mode, the gain of the amplifier circuit 212 is about 10, which results in an output signal of the amplifier circuit 212 being a maximum possible constant value of 25V. Upon receipt of a frame signal 240 indicative of commencement of a data frame according to the DSI specification, it is necessary to leave the idle mode and enter the signal mode (Step 300). Consequently, whilst the gain of the amplifier circuit 212 reduces to unity, the voltage converter 204 maintains the drive signal at 4.5V in accordance with the DSI specification. However, upon receipt of the frame signal 240, the state machine 202 instructs the voltage converter 204 to modify the output signal by generating a 5.5V pulse 402, constituting a first sandcastle waveform, in order to ensure that transition of the output signal from the initial level of 25V to 4.5 V does not result in an unacceptable amount of undershoot, because if the undershoot reaches 3.0V, a resulting amplifier output signal responsive to the drive signal 400 at the 3.0V level would be misinterpreted by the slave modules 112, 122, 132, 142 as a beginning of a data frame.

The state machine 202 then receives a duty cycle modulated input signal 242 from a signal generator (not shown). The duty cycle modulated input signal 242 is communicated, via the state machine 202, to the voltage converter 204 for up-scaling of the duty cycle modulated input signal 242. The comparator 206 monitors (Step 304) the non-inverting and inverting input terminals 216, 218 of the operational amplifier circuit 214 by comparing the signal levels at the non-inverting and inverting input terminals 216, 218.

The skilled person will appreciate that as a result of slew recovery the output signal generated by the operational amplifier circuit 214 oscillates as the output signal reaches a desired output level, for example corresponding to a logic 1. The oscillation is damped and so has a settling time associated therewith and a portion of the oscillation is an undershoot and another portion of the oscillation is an overshoot. The overshoot and undershoot generated by the operational amplifier circuit 214 is an expected level of overshoot and undershoot known at the design stage. In order to mitigate the effects of the oscillation, for example the undershoot and/or the overshoot, an intermediate signal level 404 exists at which a step 406 can be introduced into the waveform of the drive signal, the step 406 reducing, in this example, the amplitude of the undershoot in the output signal of the amplifier circuit 212, thereby reducing current flow due to the undershoot and hence false current signals being detected or masked. In this respect, the overshoot or the undershoot, is minimised or substantially suppressed from a level of about 600 mV range with respect to a 3V signal level, or about 20% of the level of the output signal, to about 200 mV with respect to the level of the output signal, or about 7% of the level of the output signal. Indeed, the overshoot or undershoot can be substantially suppressed to a level of less than about 10% of the output signal, for example between about 5% and 10% of the level of the output signal. It should also be noted that the variation of the rate of change of the voltage of the output signal with time (dV/dt) is reduced by up to a factor of 3, for example by at least a factor of 2, thereby reducing the interference with slave response current. Indeed, even if some overshoot or undershoot remains, provided dV/dt does not "force" a current in the capacitors mentioned above that is higher than a minimum slave threshold current associated with a logic level of the slave response current, data from slaves modules is not lost as a result of the overshoot or undershoot.

In this example, the intermediate level 404 is defined by the operating characteristics of the operational amplifier 214 relating to slew recovery, and the intermediate level 404 is detected by monitoring the non-inverting and inverting input terminals 216, 218 of the operational amplifier circuit 214. The comparison output signal of the comparator 206 is monitored by the state machine 202 and when the comparison signal is at a substantially zero level (Step 306), the state machine 202 issues a control signal (Step 308) to trigger the voltage converter 204 to introduce the step 406 into the waveform of the drive signal. The waveform generated is therefore a second sandcastle waveform.

Figure 5:
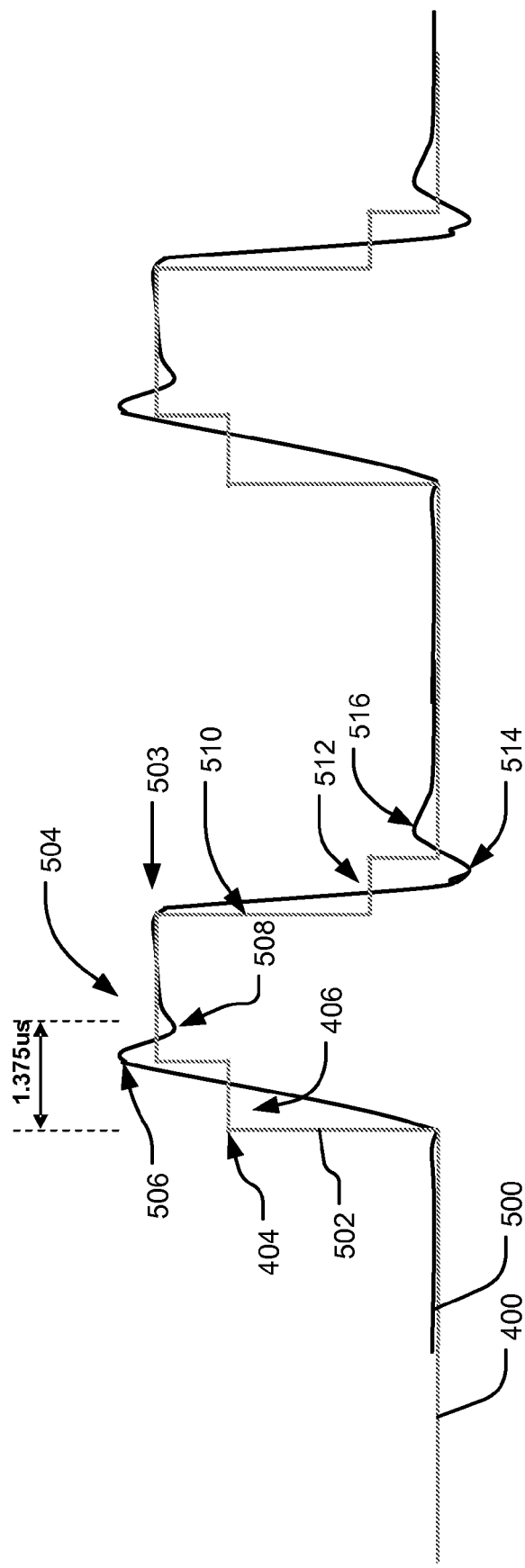
FIG. 5 is an illustration of a part of the waveform of FIG. 3 in greater detail.

Turning to FIG. 5, the output signal 500 of the amplifier circuit 212 responds to the drive signal 400 generated by the voltage converter 204. As a rising edge 502 of the drive signal 400 reaches a maximum level 503, the output signal 500 comprises the damped oscillation 504, the oscillation 504 comprising an overshoot 506 and an undershoot 508. However, due to the presence of the step 406 on the rising edge 502 of the drive signal 400, the undershoot 508 is reduced in amplitude as a result of creating a premature halt to the rising edge of the drive signal 400 and so reducing the impact of the slew rate and slew recovery before the maximum signal level is reached. Consequently, the remaining increment to the maximum signal level 503 is less than the preceding increment and so the slew recovery required is less than for a single increment to the maximum signal level 503.

In the another embodiment, the state machine 202 similarly monitors the non-inverting and inverting input terminals 216, 218 of the operational amplifier circuit 214 in respect of a falling edge 510 of the drive signal and introduces another step 512 into the waveform of the output signal in order to mitigate another oscillation 514 generated whilst the operational amplifier circuit 214 tries to transition to a low pulse signal level.

In this example, a primary goal of the introduction of the another step 512 in respect of the falling edge 510 of the drive signal is to mitigate the amplitude of another overshoot 516 of the oscillator 514. By providing the another step 512, the Sandcastle waveform is a three level waveform.

In further embodiments, either or both of the above embodiments can be modified by providing a differential input margin that precedes or succeeds the substantially signal input levels applied to the non-inverting and inverting inputs 216, 218 that are monitored by the comparator 206, for example by setting an offset of the comparator 206. Consequently, the substantially zero level generated by the comparator 206 is generated when a difference exists between the input signals applied to the non-inverting and inverting inputs 216, 218 that is within the above-mentioned margin, thereby causing early introduction of the step 406 in the waveform of the drive signal 400.

As a result of mitigating the overshoot and/or undershoot of the output signal generated by the operational amplifier circuit 204, any overshoot and/or undershoot is not of a sufficient amplitude to cause current drawn as a result of the overshoot and/or undershoot to be recognisable as a logic level by the sensor circuit 166.

It is thus possible to provide a buffer apparatus, an integrated circuit and a method of reducing a portion of an oscillation of an output signal for a communications bus that is capable of supporting greater data rates for communication over the bus. The apparatus, method and integrated circuit does not require additional die area or requires minimal additional die area and constitutes a simple solution to counteracting the effects of slew recovery without reducing the slew rate of an amplifier circuit.

Of course, the above advantages are exemplary, and these or other advantages may be achieved by the invention. Further, the skilled person will appreciate that not all advantages stated above are necessarily achieved by embodiments described herein.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-ROM or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be an type of connection suitable to transfer signals from or to the respective nodes, units or devices, for example via intermediate devices. Accordingly, unless implied or stated otherwise the connections may for example be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The term "program," as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of the master module 102 are circuitry located on a single integrated circuit or within a same device. Alternatively, the master module 102 may include any number of separate integrated circuits or separate devices interconnected with each other. For example, the driver circuit 236 may be located on a same integrated circuit as the amplifier circuit 212 or on a separate integrated circuit or located within another peripheral discretely separate from other elements of the master module 102. Also for example, the master module 102 or portions thereof may be soft or code representations of physical circuitry or of logical representations convertible into physical circuitry. As such, the master module 102 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. For example, Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A buffer apparatus for a communications bus, the apparatus comprising:
    a driver circuit having an output;
    an amplifier circuit having an input coupled to the output of the driver circuit; and
    a signal monitor coupled to the input of the amplifier circuit, wherein
        the driver circuit is arranged to generate a drive signal having a waveform that comprises a step therein so as to substantially suppress generation by the amplifier circuit of a portion of an oscillation of an output signal,
        the signal monitor monitors a differential input signal of the amplifier circuit in order to detect when the output signal reaches a predetermined intermediate level below a predetermined pulse output level, and
        the signal monitor is arranged to trigger generation of the step when the output signal reaches the predetermined intermediate level.

2. The apparatus as claimed in claim 1, wherein the waveform has a rising edge comprising the step.

3. The apparatus as claimed in claim 1, wherein the signal monitor comprises:
    a comparator, coupled to the input of the amplifier circuit, and arranged to trigger generation of the step in response to the differential input signal of the amplifier circuit being substantially zero value.

4. The apparatus as claimed in claim 1, wherein the signal monitor is arranged to trigger generation of the step in response to the output signal reaching a predetermined signal margin preceding the predetermined intermediate level relative to a slew direction of the output signal.

5. The apparatus as claimed in claim 4, wherein the predetermined signal margin is determined by an offset of the signal monitor.

6. The apparatus as claimed in claim 1, wherein the portion of the oscillation of the output signal generated by the amplifier circuit has, in an absence of the step, an expected signal level, the step being located so as to reduce the expected signal level of the portion of the oscillation.

7. The apparatus as claimed in claim 1, wherein the portion of the oscillation of the output signal is an overshoot or an undershoot.

8. The apparatus as claimed in claim 1, wherein the step is located in the waveform so that the portion of the oscillation is less than a predetermined signal threshold corresponding to a logic level.

9. The apparatus as claimed in claim 1, wherein the drive signal comprises a Sandcastle waveform.

10. The apparatus as claimed in claim 9, wherein the Sandcastle waveform is a three level Sandcastle waveform.

11. The apparatus as claimed in claim 1, wherein the driver circuit comprises:
    a voltage converter, and
    a controller coupled to the voltage converter, the controller being arranged to control the voltage converter in order to generate the waveform comprising the step.

12. The apparatus as claimed in claim 1, further comprising:
    an idle mode and a signal mode, wherein the waveform comprising the step is generated upon a transition from the idle mode to the signal mode.

13. A master module apparatus for a communications bus, the master module apparatus comprising the buffer apparatus as claimed in claim 1.

14. The apparatus as claimed in claim 13 further comprising:
    a signal detector arranged to generate a logic level in response to an input signal thereto being equal to or exceeding a predetermined signal threshold, wherein the step is located in the waveform so that the portion of the oscillation is less than the predetermined signal threshold corresponding to the logic level.

15. The apparatus as claimed in claim 14, wherein the signal detector does not generate the logic level in response to the portion of the oscillation of the output signal.

16. A distributed system interface master module apparatus comprising the buffer apparatus as claimed in claim 1.

17. An integrated circuit for a communications bus, the integrated circuit comprising:
   a driver circuit having an output;
   an amplifier circuit having an input coupled to the output of the driver circuit; and
   a signal monitor coupled to the input of the amplifier circuit; wherein
      the driver circuit is arranged to generate a drive signal having a waveform that comprises a step therein so as to substantially suppress generation by the amplifier circuit of a portion of an oscillation of an output signal,
      the signal monitor monitors a differential input signal of the amplifier circuit in order to detect when the output signal reaches a predetermined intermediate level below a predetermined pulse output level, and
      the signal monitor is arranged to trigger generation of the step when the output signal reaches the predetermined intermediate level.

18. A method of reducing a portion of an oscillation of an output signal for a communications bus, the method comprising:
   generating a drive signal having a waveform;
   monitoring a differential input signal of an amplifier circuit in order to detect when the output signal reaches a predetermined intermediate level below a predetermined pulse output level;
   triggering generation of a step in the waveform of the drive signal when the output signal reaches the predetermined intermediate level;
   applying the drive signal to an input of the amplifier circuit, wherein
      the amplifier circuit generates an output signal in response to the drive signal, generation of a portion of an oscillation component of the output signal being substantially suppressed by the presence of the step in the waveform.

19. The apparatus as claimed in claim 17, wherein the signal monitor comprises:
   a comparator, coupled to the input of the amplifier circuit, and arranged to trigger generation of the step in response to the differential input signal of the amplifier circuit being substantially zero value.

20. The apparatus as claimed in claim 17, wherein the signal monitor is arranged to trigger generation of the step in response to the output signal reaching a predetermined signal margin preceding the predetermined intermediate level relative to a slew direction of the output signal.

* * * * *